United States Patent
Lee et al.

(10) Patent No.: US 11,672,144 B2
(45) Date of Patent: Jun. 6, 2023

(54) DISPLAY DEVICE

(71) Applicant: SAMSUNG DISPLAY CO., LTD., Yongin-si (KR)

(72) Inventors: Gwangteak Lee, Cheonan-si (KR); Seongsik Choi, Asan-si (KR); Yong-sik Jung, Cheonan-si (KR); Yong-Sik Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 357 days.

(21) Appl. No.: 17/117,627

(22) Filed: Dec. 10, 2020

(65) Prior Publication Data
US 2021/0242432 A1    Aug. 5, 2021

(30) Foreign Application Priority Data
Feb. 4, 2020    (KR) .................. 10-2020-0012995

(51) Int. Cl.
*H01L 27/32*    (2006.01)
*H01L 51/52*    (2006.01)

(52) U.S. Cl.
CPC ........ *H01L 51/5275* (2013.01); *H01L 27/326* (2013.01); *H01L 51/5253* (2013.01)

(58) Field of Classification Search
CPC .................. H01L 51/5275; H01L 27/326
See application file for complete search history.

(56) References Cited

U.S. PATENT DOCUMENTS

| 2018/0314067 A1 | 11/2018 | Cho et al. |
| 2018/0350883 A1 | 12/2018 | Lee et al. |
| 2019/0088904 A1 | 3/2019 | Cho et al. |
| 2019/0130822 A1 | 5/2019 | Jung et al. |
| 2019/0171063 A1 | 6/2019 | Lim |

FOREIGN PATENT DOCUMENTS

| KR | 10-2017-0113066 | 10/2017 |
| KR | 10-2018-0121750 | 11/2018 |
| KR | 10-2018-0133024 | 12/2018 |
| KR | 10-2019-0033116 | 3/2019 |
| KR | 10-2019-0066645 | 6/2019 |

*Primary Examiner* — Douglas M Menz
(74) *Attorney, Agent, or Firm* — F. Chau & Associates, LLC

(57) ABSTRACT

The present disclosure relates to a display device. The display device includes a substrate. The substrate includes a first display area, a second display area, a plurality of first pixels, a plurality of second pixels, and a plurality of diffraction patterns. The plurality of first pixels are disposed on the first display area. The plurality of second pixels are disposed on the second display area. The plurality of diffraction patterns are disposed on the second pixels When viewed in a plane orientation, an array density of the first pixels disposed in the first display area is greater than an array density of the second pixels disposed in the second display area.

20 Claims, 15 Drawing Sheets

DISPLAY DEVICE

CROSS-REFERENCE TO RELATED APPLICATION

This U.S. non-provisional patent application claims priority under 35 U.S.C. § 119 of Korean Patent Application No. 10-2020-0012995, filed on Feb. 4, 2020, the contents of which are incorporated by reference herein in their entirety.

BACKGROUND

1. Field of Disclosure

The present disclosure relates to a display device. More particularly, the present disclosure relates to a display device with increased visibility in a display area in which sensors are arranged.

2. Description of the Related Art

Display devices are used to display an image to a user through a display screen. Mobile phones, digital cameras, computers, navigation units, and televisions are examples of display devices. Display devices may include a display area and a non-display area. The display area contains a display panel through which an image is provided to the user and the non-display area may refer to the bezel around the display area.

A reduction in size of the bezel area of the display device may result in an increased size of the display panel. As the display panel size is increased, multiple display panels may be used for general image viewing and various touch-input options. However, in some cases, using multiple display panels results in a reduction in display quality between the display panels. Therefore, there is a need in the art for a method to increase visibility in a display area when multiple display panels are in use.

SUMMARY

The present disclosure provides a display device with increased visibility in a display area in which sensors are arranged among display areas.

Embodiments of the inventive concept provide a display device including a substrate including a first display area and a second display area, a plurality of first pixels disposed on the first display area, a plurality of second pixels disposed on the second display area, and a plurality of diffraction patterns disposed on the second pixels. An array density of the first pixels disposed in the first display area is greater than an array density of the second pixels disposed in the second display area when viewed in a plane.

Embodiments of the inventive concept provide a display device including a substrate including a first display area and a second display area, a plurality of first pixels disposed on the first display area, a plurality of second pixels disposed on the second display area, and a plurality of diffraction patterns disposed on the second pixels. An array density of the first pixels disposed in the first display area is greater than an array density of the second pixels disposed in the second display area when viewed in a plane, and heights of the diffraction patterns vary as a distance from the first display area increases.

Embodiments of the inventive concept provide a display device including a substrate including a first display area and a second display area, a plurality of first pixels disposed on the first display area, a plurality of second pixels disposed on the second display area, and a plurality of diffraction patterns disposed on the second pixels. The first pixels are grouped into a plurality of first pixel groups, the second pixels are grouped into a plurality of second pixel groups, an array density of the first pixels disposed in the first display area is greater than an array density of the second pixels disposed in the second display area when viewed in a plane, and distances between the second pixel groups vary as a distance from the first display area increases.

According to the above, the diffraction patterns are disposed on the second display area in which the sensors are disposed, and thus, a difference in sharpness between the first display area and the second display area is reduced. As a result, a display quality of the display device may be increased.

In addition, the sharpness of the second display area may vary by the diffraction patterns or the second pixel groups, which have a variety of arrangements. Thus, the difference in sharpness between the first display area and the second display area may be more reduced.

BRIEF DESCRIPTION OF THE DRAWINGS

The present disclosure will become readily apparent by reference to the following detailed description when considered in conjunction with the accompanying drawings wherein.

DETAILED DESCRIPTION

Figure 1:
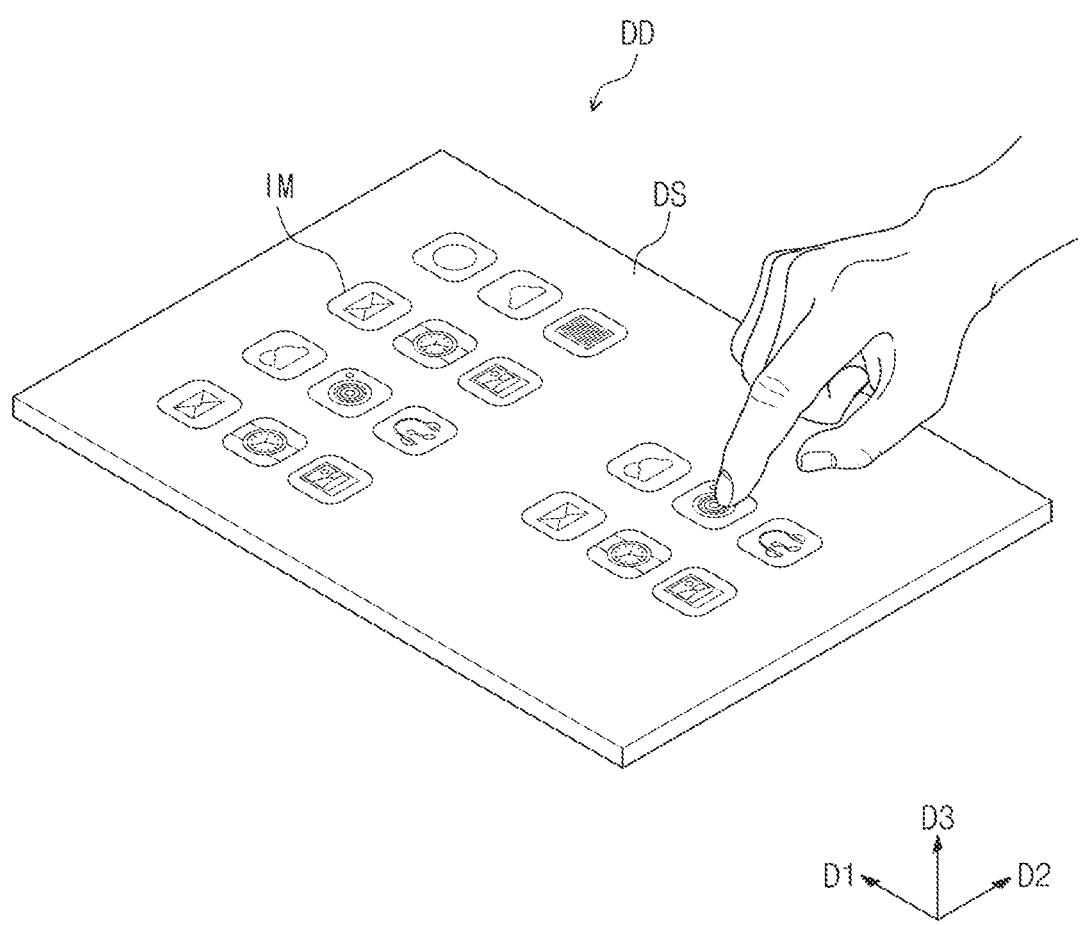
FIG. 1 is a perspective view showing a display device according to an exemplary embodiment of the present disclosure.

The present disclosure relates to a display device that includes a display area and a non-display area. The display area may include multiple panels located in a first display area and a second display area. Various sensors may be located within the second display area (e.g., on a rear surface). The density of pixels in the first display area may be greater than the density of pixels in the second display area. Diffraction patterns located in the second display area may be used to diffract light incident to the second display area. Accordingly, the visibility of a second display area may be improved.

According to one embodiment, the display device includes a substrate with a first display area, a second display area, a plurality of first pixels, a plurality of second pixels, and a plurality of diffraction patterns. The plurality of first pixels are disposed on the first display area. The plurality of second pixels are disposed on the second display area. The plurality of diffraction patterns are disposed on the second pixels. When viewed in a plane orientation, an array density of the first pixels disposed in the first display area is greater than an array density of the second pixels disposed in the second display area.

In the present disclosure, it will be understood that when an element or layer is referred to as being "on", "connected to" or "coupled to" another element or layer, the element or layer can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Therefore, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted with a meaning consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in detail with reference to the accompanying drawings.

FIG. 1 is a perspective view showing a display device DD according to an exemplary embodiment of the present disclosure.

Referring to FIG. 1, the display device DD according to the exemplary embodiment of the present disclosure may have a rectangular shape defined by long sides extending in a first direction D1 and short sides extending in a second direction D2 crossing the first direction D1. However, the shape of the display device DD should not be limited to the rectangular shape. The display device DD may have a variety of shapes, such as a circular shape or a polygonal shape.

Hereinafter, a direction substantially perpendicular to a plane defined by the first direction D1 and the second direction D2 may be referred to as a "third direction D3".

An upper surface of the display device DD may be referred to as a "display surface DS" and may be a plane surface defined by the first direction D1 and the second direction D2. Images IM generated by the display device DD may be provided to a user through the display surface DS.

The display device DD may be applied to a large-sized electronic item, such as a television, a monitor, or an outdoor billboard, and a small or medium-sized electronic item. A small or medium-sized electronic item may be considered a personal computer, a notebook computer, a personal digital assistant, a car navigation unit, a game unit, a smartphone, a tablet computer, and a camera. However, these are merely exemplary. Therefore, the display device DD may be applied to other electronic devices if the other electronics do not depart from the concept of the present disclosure.

Figure 2:
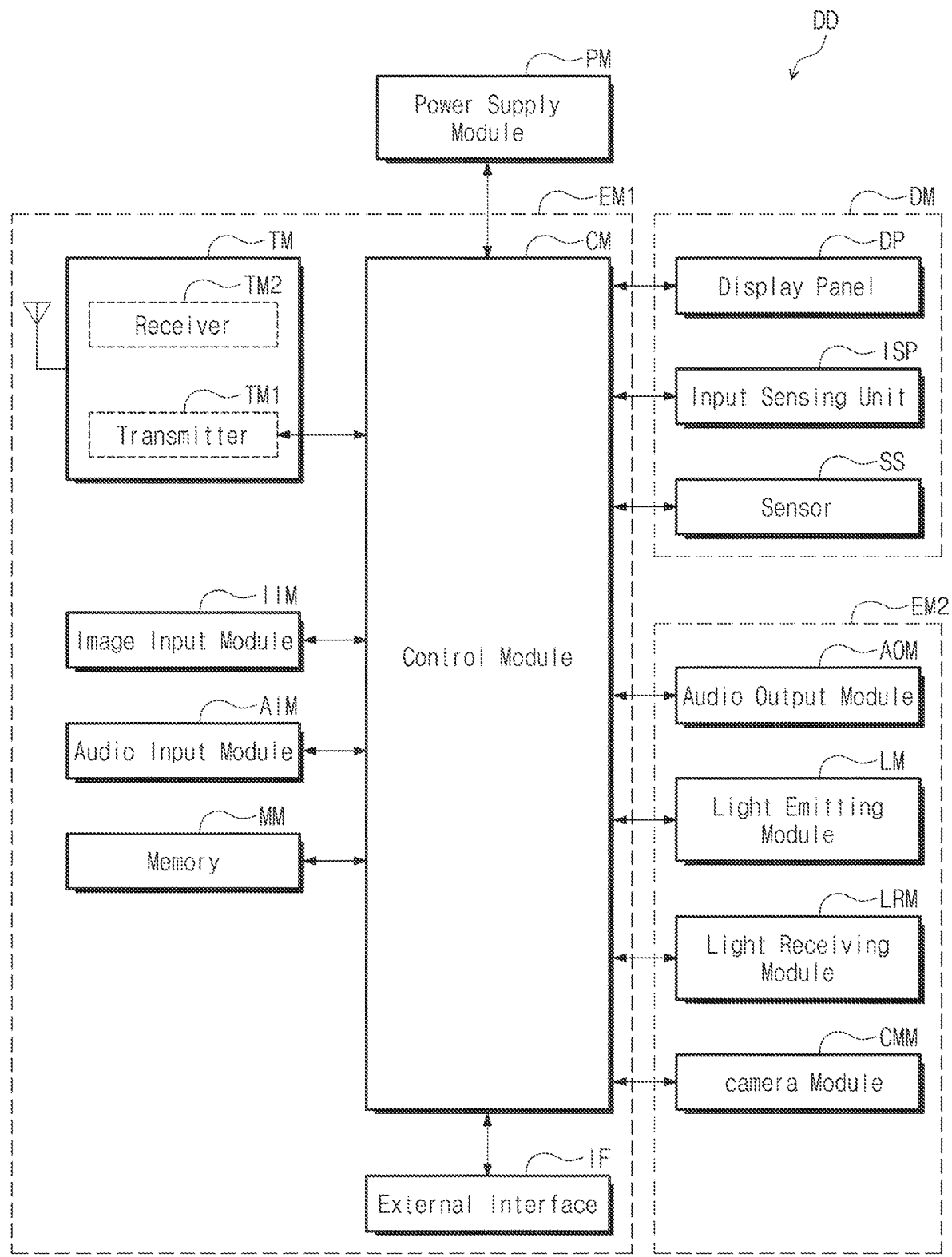
FIG. 2 is a block diagram showing the display device shown in FIG. 1.

FIG. 2 is a block diagram showing the display device DD shown in FIG. 1.

Referring to FIG. 2, the display device DD may include a display module DM, a power supply module PM, a first electronic module EM1, and a second electronic module EM2. The display module DM, the power supply module PM, the first electronic module EM1, and the second electronic module EM2 may be electrically connected.

The power supply module PM may supply a power source for the overall operation of the display device DD. The power supply module PM may include a normal battery module.

The first electronic module EM1 and the second electronic module EM2 may include a variety of functional modules to drive the display device DD. The first electronic module EM1 may be mounted directly on a mainboard, wherein the mainboard is electrically connected to the display module DM. Additionally or alternatively, the first electronic module EM1 may also be electrically connected to the mainboard via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mainboard through a flexible circuit board without being mounted on the mainboard.

The control module CM may control an overall operation of the display device DD. The control module CM may activate or deactivate the display module DM. The control module CM may control other modules based on a touch signal provided from the display module DM. The other modules that may be controlled may be the image input module IIM or the audio input module AIM. The control module CM may perform a user authentication mode using fingerprint information provided from the display module DM.

The wireless communication module TM may transmit/receive a wireless signal to/from other terminals using a Bluetooth or WiFi link. The wireless communication module TM may transmit/receive a voice signal using a general communication line. The wireless communication module TM may include a transmitter TM1. The transmitter TM1 may modulate a signal to be transmitted and may transmit the modulated signal and a receiver TM2 that demodulates a signal applied thereto.

The image input module IIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket (e.g., a memory card and a SIM/UIM card), etc.

The second electronic module EM2 may include an audio output module AOM, a light-emitting module LM, a light-receiving module LRM, and a camera module CMM. The modules may be mounted directly on the mainboard, may be electrically connected to the display module DM through a connector (not shown) after being mounted on a separate substrate, or may be electrically connected to the first electronic module EM1.

The audio output module AOM may convert audio data provided from the wireless communication module TM or audio data stored in the memory MM and may output the converted audio data to the outside. The light-emitting module LM may generate a light and may output the light. The light-emitting module LM may emit an infrared ray and may include an LED element. The light-receiving module LRM may sense the infrared ray. The light-receiving module LRM may be activated when the infrared ray with a predetermined level or higher is sensed. The light-receiving module LRM may include a complementary metal-oxide-semiconductor (CMOS) sensor.

The infrared ray generated by and output from the light-emitting module LM may be reflected by an external object, e.g., a user's finger or face. The reflected infrared ray may be incident into the light-receiving module LRM. The camera module CMM may take an image of an external object.

The display module DM may include a display panel DP, an input sensing unit ISP, and a sensor SS. As an example, the display panel DP, the input sensing unit ISP, and the sensor SS are shown. However, the display module DM may further include a window.

The display panel DP may display the image using the image data provided from the control module CM. The control module CM may drive the display module DM in an initial mode and a main mode following the initial mode.

The initial mode may be defined as a user authentication mode. When the user is authenticated as a registered user in the initial mode, the control module CM may drive the display panel DP in the main mode. In the main mode, the display panel DP may display a variety of images desired by the user. A user authentication method may be performed in various ways, such as a fingerprint authentication method, a password authentication method, and a facial recognition authentication method. Hereinafter, the fingerprint authentication method will be described as the user authentication method.

The input sensing unit ISP may sense external input, e.g., a user's hand or a touch pen. Additionally or alternatively, the input sensing unit ISP may transmit the sensed signal to the control module CM as an input signal. The control module CM may control an operation of the display panel DP and the fingerprint sensing unit FSP in response to the input signal.

The input sensing unit ISP may include a plurality of sensing electrodes to sense the external input. The sensing electrodes may sense the external input by using a capacitive method.

A sensor SS may include a variety of sensors, such as, an illuminance sensor, a camera sensor, a motion sensor, and a fingerprint sensor. The sensor SS may recognize information input by the user using external light. To this end, an optical path through which the external light transmits may be defined in an area in which the sensor SS is disposed above the display panel DP.

Figure 3:
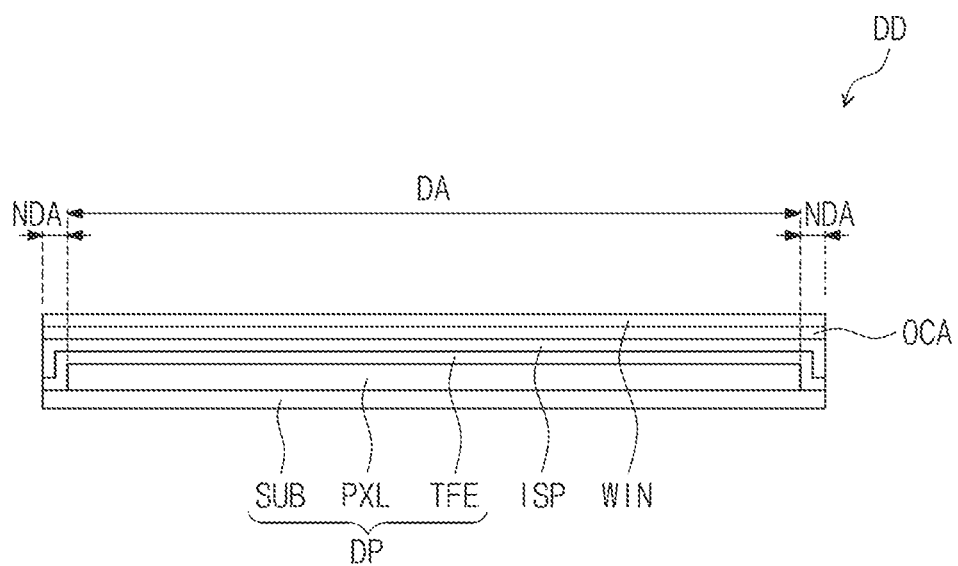
FIG. 3 is an exemplary sectional view showing a display module shown in FIG. 2.

FIG. 3 is an exemplary cross-sectional view showing a display module shown in FIG. 2.

Referring to FIG. 3, the input sensing unit ISP may be disposed on the display panel DP. A window WIN may be disposed on the input sensing unit ISP.

The display panel DP, according to the exemplary embodiment of the present disclosure, may be a light-emitting type display panel. However, the display panel DP should not be particularly limited. For instance, the display panel DP may be an organic light-emitting display panel or a quantum dot light-emitting display panel. A light-emitting layer of the organic light-emitting display panel may include an organic light-emitting material. A light-emitting layer of the quantum dot light-emitting display panel may include a quantum dot and/or a quantum rod. Hereinafter, the organic light-emitting display panel will be described as a representative example of the display panel DP.

The display panel DP may include a substrate SUB, a pixel layer PXL disposed on the substrate SUB, and a thin-film encapsulation layer TFE disposed on the substrate SUB to cover the pixel layer PXL. The substrate SUB may be a transparent substrate and may include a flexible plastic substrate. For example, the substrate SUB may include polyimide (PI).

The substrate SUB may include a display area DA and a non-display area NDA defined around the display area DA. The display area DA may be defined as an area through which a screen is implemented. The non-display area NDA may be defined as an edge of the display device DD.

Detailed descriptions about the pixel layer PXL and the thin-film encapsulation layer TFE disposed on the substrate SUB will be described later.

The window WIN may protect the display panel DP and the input sensing unit ISP from external scratches and impacts. The window WIN may be attached to the input sensing unit ISP by an adhesive OCA. The adhesive OCA may include a variety of adhesives, such as an optically clear adhesive or a pressure-sensitive adhesive. The image generated by the display panel DP may be provided to a user through the window WIN.

The input sensing unit ISP may be manufactured directly on the display panel DP when the display module DM is manufactured. However, the input sensing unit ISP should not be limited thereto or thereby. For example, the input sensing unit ISP may be manufactured as an input sensing panel separate from the display panel DP. Additionally or alternatively, the input sensing unit ISP may be attached to the display panel DP by the adhesive.

Although not shown in figures, the sensors SS (refer to FIG. 2) may be disposed under the display panel DP. The sensors may be disposed in a predetermined area of the display panel DP. For example, the illuminance sensor, the motion sensor, the camera sensor, and the like may be disposed below the display panel DP.

Figure 4:
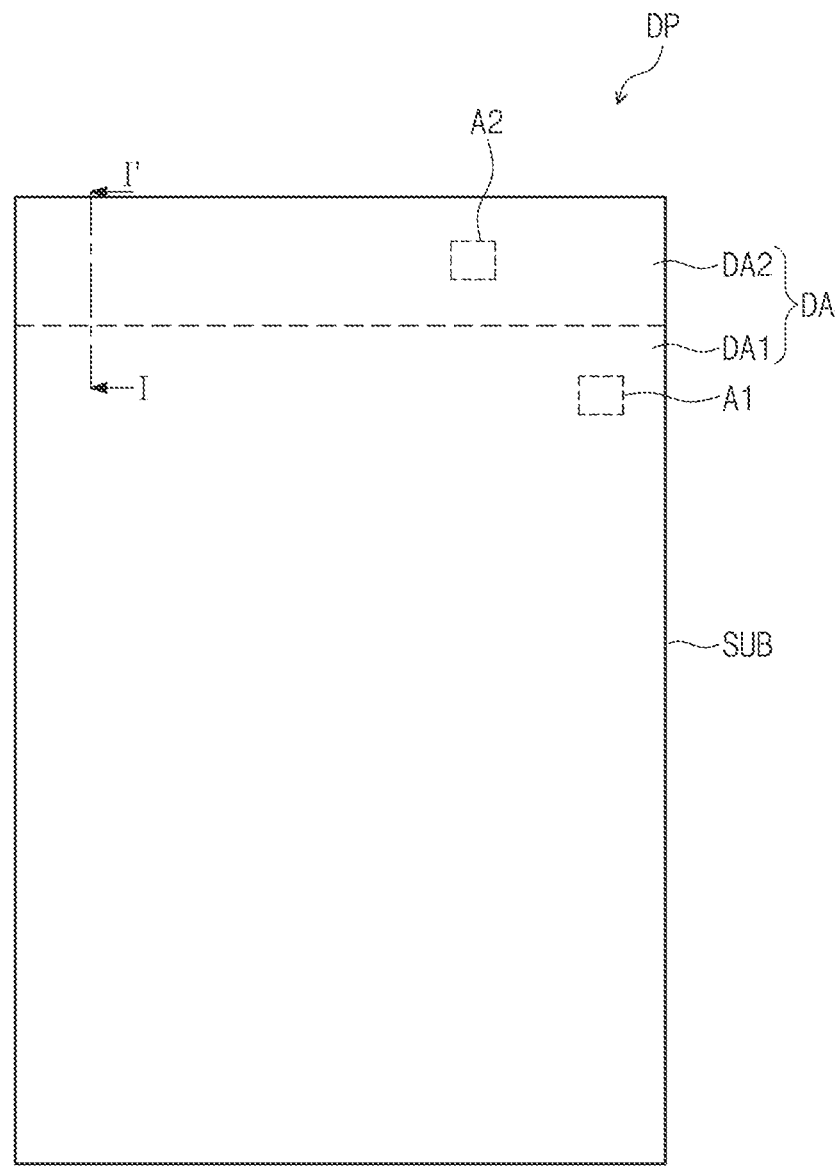
FIG. 4 is a plan view showing a display panel shown in FIG. 3.

FIG. 4 is a plan view showing the display panel DP shown in FIG. 3.

For the convenience of explanation, the pixels disposed on the substrate SUB and the non-display area are omitted in FIG. 4.

Referring to FIG. 4, the display area DA of the substrate SUB may include a first display area DA1 and a second display area DA2. The first display area DA1 may be defined as a general display area. The second display area DA2 may be defined as an area in which the sensors are arranged. In some examples, the sensors arranged in the second display area DA2 may includes sensors other than a touch input sensor, which may overlap the first display area DA1. In some embodiments, different display panels are used in the first display area DA1 and the second area DA2.

The first display area DA1 may include long sides in the first direction D1 and short sides in the second direction D2. When viewed in a plane, the first display area DA1 may have a rectangular shape. In some embodiments, the first display area DA1 is wider than the second display area DA2.

The second display area DA2 may be disposed adjacent to one side of the first display area DA1. The second display area DA2 may include short sides in the first direction D1 and long sides in the second direction D2. A length of the long sides of the second display area DA2 may be the same as a length of the short sides of the first display area DA1, but the present disclosure is not limited thereto.

The sensors (not shown) may be disposed in the second display area DA2. For example, the sensors may include the illuminance sensor, the motion sensor, the camera sensor, and the like. The sensors may be disposed under the substrate SUB and may be arranged to overlap the second display area DA2.

The non-display area NDA (refer to FIG. 3) of the display device DD, according to the present exemplary embodiment, may be implemented to be considerably thinner compared with a size of the display area DA. The pixels may be arranged in the first display area DA1 and the second display area DA2. Accordingly, the display device DD may display the image in the first display area DA1 corresponding to the general display area and in the second display area DA2 in which the sensors are arranged.

Consequently, the display device DD, according to the present exemplary embodiment, may provide a wider display screen to the user.

However, the shape of the second display area DA2 should not be limited to the above shape. The second display area DA2 may be defined at any position on the substrate SUB according to the type of sensors the number of sensors, the arrangement position of sensors arranged in the display device DD, and the like.

The number of pixels arranged in the unit area of the first display area DA1 may be larger than the number of pixels arranged in the unit area of the second display area DA2. Hereinafter, the pixels arranged in the first display area DA1 and the second display area DA2 will be described in more detail.

Figure 5:
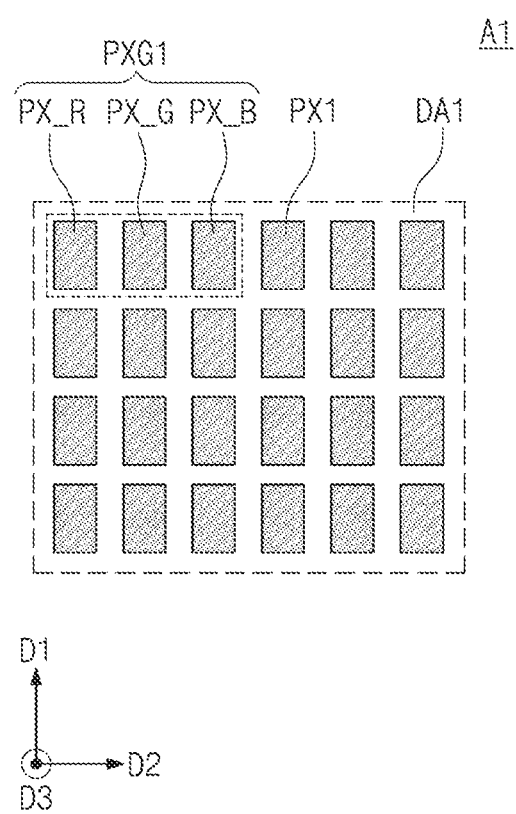
FIG. 5 is an enlarged view showing an area A1 shown in FIG. 4.
Figure 6:
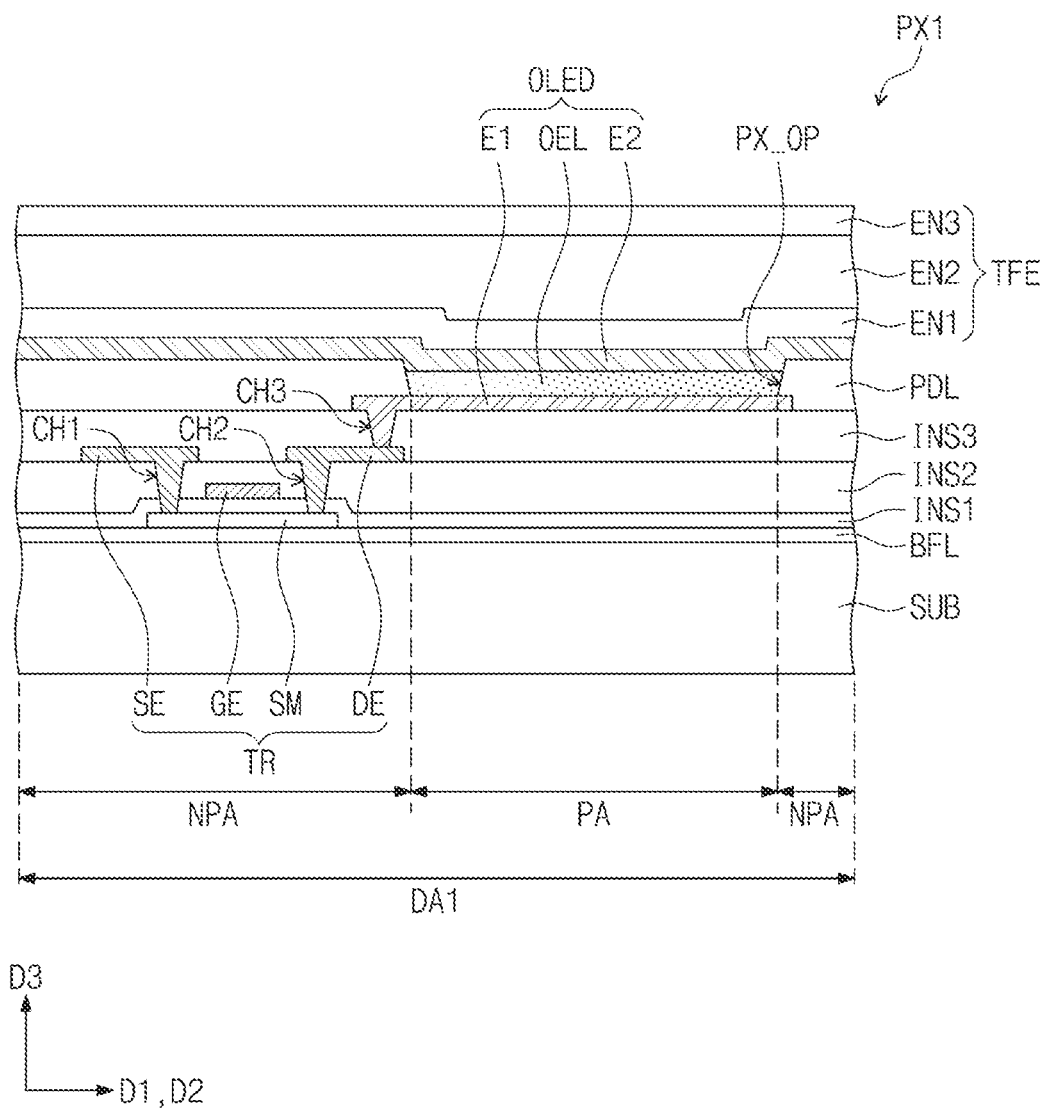
FIG. 6 is a cross-sectional view showing a first pixel shown in FIG. 5.

FIG. 5 is an enlarged view showing an area A1 shown in FIG. 4, and FIG. 6 is a cross-sectional view showing a first pixel shown in FIG. 5.

Referring to FIG. 5, a plurality of first pixels PX1 may be arranged in the first display area DA1. The first pixels PX1 may be arranged in the first direction D1 and a second direction D2. The first pixels PX1 may be spaced apart from each other.

The first pixels PX1 may have long sides in the first direction D1 and short sides in the second direction D2. When viewed in a plane, each of the first pixels PX1 may have a rectangular shape.

Each of the first pixels PX1 may include a plurality of red pixels PX_R, a plurality of green pixels PX_G, and a plurality of blue pixels PX_B. That is, each pixel may include a plurality of subpixels having a plurality of colors. Each pixel or subpixel may include a light emitting diode (LED), an organic light emitting diode (OLED), or another suitable electronic component capable of emitting light.

The first pixels PX1 may be grouped into a plurality of first pixel groups PXG1. For example, the first pixel group PXG1 may include the red pixel PX_R, the green pixel PX_G, and the blue pixel PX_B.

The first pixel groups PXG1 may be arranged in a first area A1 of the first display area DA1. The first area A1 may mean a unit area. For example, the first area A1 may have a 1-inch-by-1-inch size.

The first pixel groups PXG1 may be arranged in a matrix form in the first area A1. For example, the first pixel groups PXG1 may be arranged in the first direction D1 and the second direction D2 to be spaced apart from each other.

In FIG. 5, eight first pixel groups PXG1 are arranged in the first area A1. However, this is merely exemplary, and the present disclosure should not be limited thereto or thereby. The number of the first pixel groups PXG1 arranged in the first area A1 may be larger than eight.

For the convenience of description, the first pixels PX1 with rectangular shapes are shown. However, this is merely exemplary, and the first pixels PX1 may have a variety of shapes. For example, the first pixels PX1 may include a light-emitting element and a transistor. An area in which the light-emitting element and the transistor are disposed should not be limited to a quadrangular shape.

Referring to FIG. 6, the first pixel PX1 may include the light-emitting element OLED and the transistor TR connected to the light-emitting element OLED. The light-emitting element OLED may include a first electrode E1, a second electrode E2, and an organic light-emitting layer OEL. The organic light-emitting layer OEL may be disposed between the first electrode E1 and the second electrode E2. The first electrode E1 may be an anode and the second electrode E2 may be a cathode. The transistor TR may be a light-emitting control transistor.

The first display area DA1 may include a light-emitting area PA and a non-light-emitting area NPA around the light-emitting area PA. The non-light-emitting area NPA may surround the light-emitting area PA. The light-emitting element OLED of the first pixel PX1 may be disposed in the light-emitting area PA. The transistor TR may be disposed in the non-light-emitting area NPA. A buffer layer BFL may be disposed on the substrate SUB. The buffer layer BFL may include an inorganic material.

A semiconductor layer SM of the transistor TR may be disposed on the buffer layer BFL. The semiconductor layer SM may include an inorganic semiconductor, such as amorphous silicon or polycrystalline silicon, or an organic semiconductor. Additionally or alternatively, the semiconductor layer SM may include an oxide semiconductor. Although not shown in FIG. 6, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap the semiconductor layer SM. The gate electrode GE may be disposed to overlap the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM through a first contact hole CH1. The first contact hole CH1 may be defined through the first insulating layer INS1 and the second insulating layer INS2. The drain electrode DE may be connected to the drain area of the semiconductor layer SM through a second contact hole CH2. The second contact hole CH2 may be defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be defined as a planarization layer to provide a flat upper surface and may include an organic material.

The first electrode E1 may be disposed on the third insulating layer INS3. The first electrode E1 may be connected to the drain electrode DE of the transistor TR through a third contact hole CH3 defined through the third insulating layer INS3. The first electrode E1 may be defined as a pixel electrode. The first electrode E1 may include a transmissive electrode or a reflective electrode.

A pixel definition layer PDL may be disposed on the first electrode E1 and the third insulating layer INS3 to expose a predetermined portion of the first electrode E1. A pixel opening PX_OP may be defined through the pixel definition layer PDL to expose the predetermined portion of the first electrode E1.

A light emitting layer such as an organic light-emitting layer OEL may be disposed on the first electrode E1 in the pixel opening PX_OP. The organic light-emitting layer OEL may generate a light with a red, green, or blue color. However, the organic light-emitting layer OEL should not be limited thereto or thereby. The organic light-emitting layer OEL may generate a white light by a combination of organic materials generating red, green, and blue colors.

The second electrode E2 may be disposed on the pixel definition layer PDL and the organic light-emitting layer OEL. The second electrode E2 may be defined as a common electrode. The second electrode E2 may include a transmissive electrode or a reflective electrode.

When the display panel DP is a front surface light-emitting type organic light-emitting display panel, the first electrode E1 may be the reflective electrode. The second electrode E2 may be the transmissive electrode. When the display panel DP is a rear surface light-emitting type organic light-emitting display panel, the first electrode E1 may be the transmissive electrode and the second electrode E2 may be the reflective electrode. The first electrode E1 may be the anode electrode that may be a hole injection electrode. The second electrode E2 may be the cathode electrode that may be an electron injection electrode.

The thin-film encapsulation layer TFE may be disposed on the light-emitting element OLED to cover the pixel PX. The thin-film encapsulation layer TFE may include a first encapsulation layer EN1, a second encapsulation layer EN2, and a third encapsulation layer EN3. The first encapsulation layer EN1 may be disposed on the light-emitting element OLED. The second encapsulation layer EN2 may be disposed on the first encapsulation layer EN1. The third encapsulation layer EN3 may be disposed on the second encapsulation layer EN2.

Each of the first and third encapsulation layers EN1 and EN3 may include an inorganic material. The second encapsulation layer EN2 may include an organic material. The second encapsulation layer EN2 may have a thickness greater than a thickness of each of the first and third encapsulation layers EN1 and EN3.

A first voltage ELVDD may be applied to the first electrode E1. A second voltage ELVSS may be applied to the second electrode E2. Holes and electrons injected into the organic light-emitting layer OEL may be recombined to generate excitons. The organic light-emitting element OLED may emit the light by the excitons that return to a ground state from an excited state. Accordingly, the organic light-emitting element OLED emits the red light, the green light, and the blue light according to a current flow, thereby displaying the image.

Figure 7:
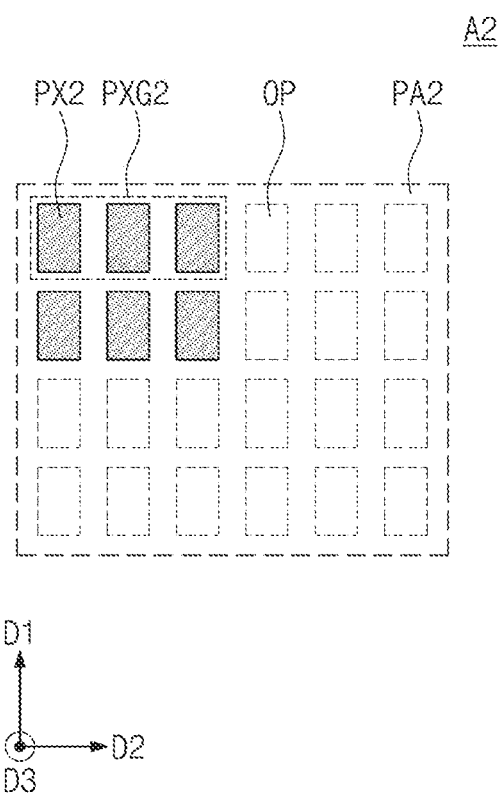
FIG. 7 is an enlarged view showing an area A2 shown in FIG. 4.

FIG. 7 is an enlarged view showing an area A2 shown in FIG. 4.

Referring to FIG. 7, a plurality of second pixels PX2 may be disposed in a second area A2 of the second display area DA2. The second area A2 may include the second pixels PX2 and a plurality openings OP. The pixels may not be disposed in the openings OP. The second pixels PX2 may have substantially the same structure in a cross-section view.

The second pixels PX2 may be grouped into a plurality of second pixel groups PXG2. For example, the second pixel groups PXG2 may include red pixels, green pixels, and blue pixels.

The second area A2 may be defined as a unit area like the first area A1. For example, the second area A2 may have substantially the same size as that of the first area A1.

Two second pixel groups PXG2 may be disposed in the second area A2. Areas of the second area A2 except for the areas in which the second pixel groups PXG2 are disposed may be defined as openings OP. The openings OP may be an optical path through which the external light passes. Accordingly, the sensors disposed in the second display area DA2 may sense the light passing through the openings OP and may sense input information by the user.

Referring to FIGS. 5 and 7, an array density of the first pixels PX1 arranged in the first display area DA1 may be greater than an array density of the second pixels PX2 arranged in the second display area DA2 when viewed in a plane.

For example, twenty-four first pixels PX1 may be arranged in the first area A1 of the first display area DA1. Six second pixels PX2 may be arranged in the second area A2 of the second display area DA2. The first area A1 and the second area A2 may correspond to the unit area. For example, the first pixels PX1 arranged in the first display area DA1 may be arranged at a higher density than the second pixels PX2 arranged in the second display area DA2.

However, the array density of the pixels may be changed depending on a size of a unit pixel rather than the number of the pixels. For example, the number of the first pixels arranged in the first area may be the same as the number of the second pixels arranged in the second area. However, in a case where an area of each of the first pixels is greater than an area of each of the second pixels when viewed in a plane, the array density of the first pixels arranged in the first display area may be higher than the array density of the second pixels arranged in the second display area.

Figure 8:
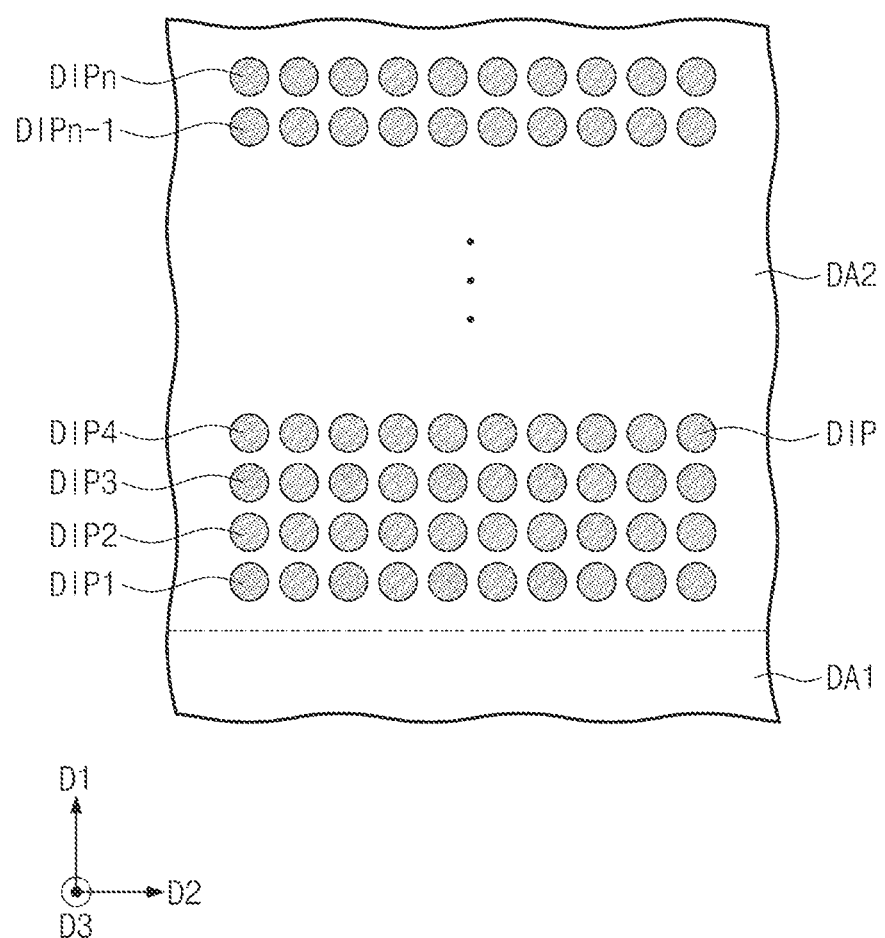
FIG. 8 is a plan view showing diffraction patterns disposed on second pixels shown in FIG. 7.
Figure 9:
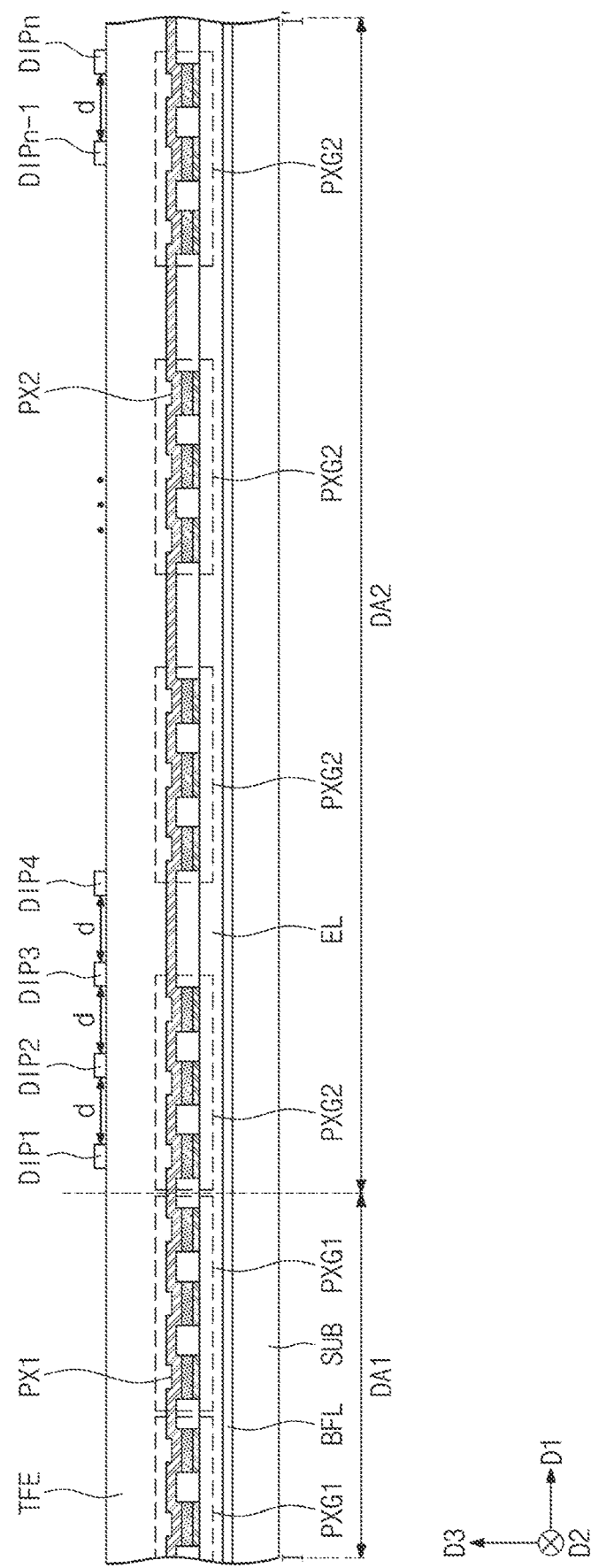
FIG. 9 is a cross-sectional view taken along a line I-I' shown in FIG. 4.

FIG. 8 is a plan view showing diffraction patterns DIP disposed on second display area shown in FIG. 7. FIG. 9 is a cross-sectional view taken along a line I-I' shown in FIG. 4.

For the convenience of explanation, a layer disposed between the buffer layer BFL and the first electrode E1 of the light-emitting element OLED in FIG. 6 may be defined as an element layer EL in FIG. 9.

Referring to FIG. 8, the diffraction patterns DIP may be disposed on the second display area DA2. In more detail, the diffraction patterns DIP may be disposed on the second pixels PX2. The diffraction patterns DIP may diffract light incident on the second display area DA2 to increase visibility of images display thereon.

For example, the sharpness of the second display area DA2 may be lowered as the distance from the first display area DA1 increases. Reducing the sharpness of the display of the second display area DA2 may increase the overall visibility of the display device.

The diffraction patterns DIP may have a cylindrical shape extending in the third direction D3. Accordingly, the diffraction patterns DIP may have a predetermined height in the third direction D3 and may have a circular shape when viewed in a plane.

However, the shape of the diffraction patterns DIP should not be limited thereto or thereby. The diffraction patterns DIP may have a polygonal pillar shape. For instance, the diffraction patterns DIP may have a variety of shapes, such as a square pillar, a pentagonal pillar, or a hexagonal pillar.

The diffraction patterns DIP may be formed of a transparent of translucent material. In some examples, the diffraction patterns DIP may include an inorganic material. For instance, the diffraction patterns DIP shown in FIG. 8 may be formed by etching an inorganic layer. The inorganic layer may include at least one of silicon oxide, silicon nitride, and silicon oxynitride.

The diffraction patterns DIP may be arranged in the first direction D1 and the second direction D2 to be spaced apart from each other. In detail, the diffraction patterns DIP may include first diffraction patterns DIP1 to n-th diffraction patterns DIPn. The first diffraction patterns DIP1 may be diffraction patterns that are adjacent to the first display area DA1 among the diffraction patterns DIP in the first direction D1. The n-th diffraction patterns DIPn may be diffraction patterns that are the farthest from the first display area DA1 among the diffraction patterns DIP in the first direction D1. The first diffraction patterns DIP1 to the n-th diffraction patterns DIPn may include a plurality of diffraction patterns arranged in the second direction D2 to be spaced apart from each other.

Referring to FIG. 9, the first pixel groups PXG1 and the second pixel groups PXG2 may be disposed on the first display area DA1 and the second display area DA2, respectively. A distance between the first pixel groups PXG1 adjacent to each other may be smaller than a distance between the second pixel groups PXG2 adjacent to each other. The thin-film encapsulation layer TFE may be disposed on the first pixel groups PXG1 and the second pixel groups PXG2.

The first to n-th diffraction patterns DIP1 to DIPn may be disposed on the second display area DA2. The first to n-th diffraction patterns DIP1 to DIPn may be diffraction patterns arranged in one column among the diffraction patterns DIP shown in FIG. 8.

The diffraction patterns DIP may be disposed on an upper surface of the thin-film encapsulation layer TFE. Although not shown in figures, an insulating layer may be disposed on the diffraction patterns DIP. The input sensing unit ISP (refer to FIG. 3) may be disposed on the insulating layer. However, the diffraction patterns DIP may not be disposed on the upper surface of the thin-film encapsulation layer TFE. The diffraction patterns DIP may be disposed regardless of a specific position as long as the diffraction patterns DIP are disposed on the second pixels PX2. For example, the diffraction patterns DIP may be disposed on the input sensing unit ISP (refer to FIG. 3).

Distances between the diffraction patterns DIP may be uniform. In detail, the distance d in the first direction D1 between the diffraction patterns DIP adjacent to each other may be uniform. Although not shown in figures, the distance in the second direction D2 between the diffraction patterns DIP adjacent to each other may be uniform.

As shown in FIG. 9, the diffraction patterns DIP may be disposed to overlap the second pixels PX2. The diffraction patterns DIP may diffract lights provided from the second pixels PX2 to enlarge a light emission area on the second display area DA2.

In detail, portions of the lights exiting from the second pixels PX2 may be provided to the diffraction patterns DIP. The other portions of the lights exiting from the second pixels PX2 may be provided to between the diffraction patterns DIP. In the second display area DA2, an effective light emission area and sharpness of the second display area DA2 may increase due to an interference phenomenon of the lights provided to the diffraction patterns DIP and the lights provided to between the diffraction patterns DIP.

According to the exemplary embodiment of the present disclosure, the display device DD may include the diffraction patterns DIP disposed on the second display area DA2. Therefore, a difference in sharpness between the first display area DA1 and the second display area DA2 is reduced. As a result, display quality of the display device DD may be increased.

FIGS. 10 to 15 are cross-sectional views showing display panels of display devices according to exemplary embodiments of the present disclosure.

Hereinafter, display panels, according to other exemplary embodiments, will be described with reference to FIGS. 10 to 15. In FIGS. 10 to 15, different features from the above-described embodiments will be described in detail, and detailed descriptions of the same elements as those of the above-described embodiments will be omitted.

The distances between the diffraction patterns DIP1 to DIPn may vary as a distance from the first display area DA1 increases.

Figure 10:
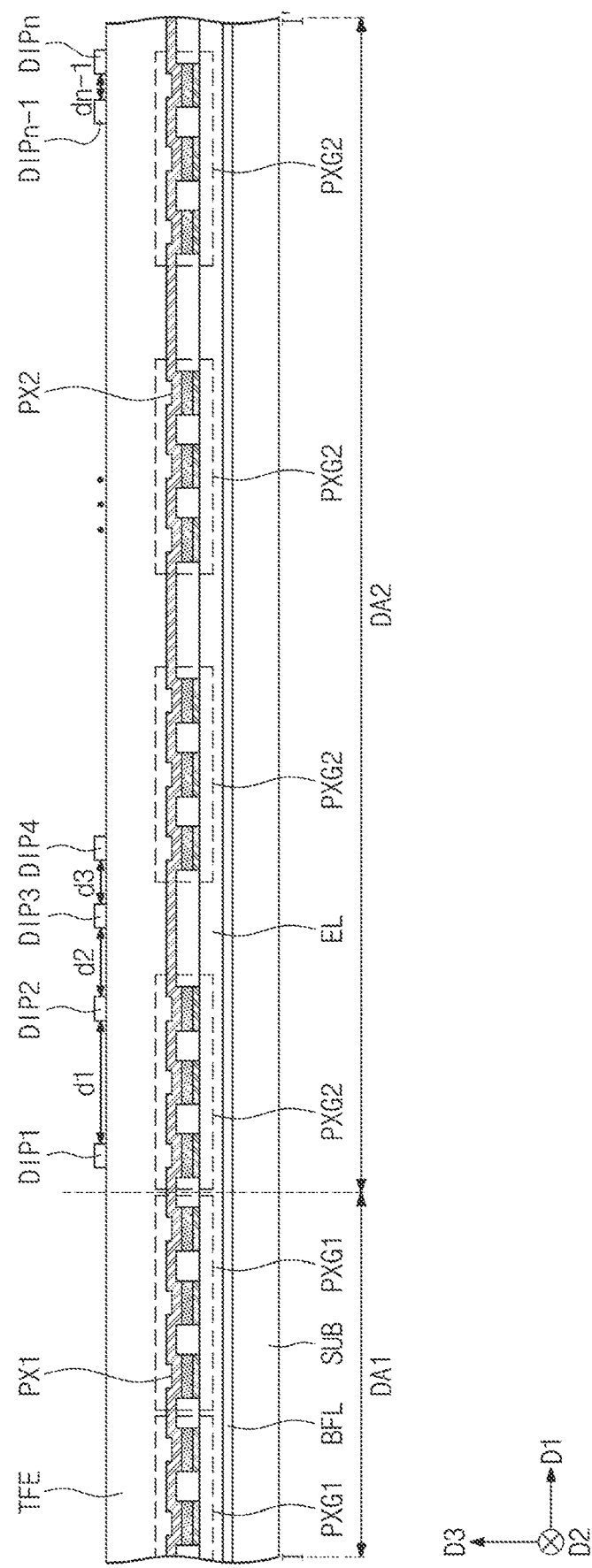
FIGS. 10 to 15 are cross-sectional views showing display panels of display devices according to exemplary embodiments of the present disclosure.

Referring to FIG. 10, distances between the diffraction patterns DIP1 to DIPn may vary based on the distance from the first display area DA1. For example, the distance between diffraction patterns may decrease as a distance from the first display area DA1 increases. The change in the distance may be sufficiently gradual such that a user will not notice a change in sharpness caused by the diffraction patterns DIP1 to DIPn.

A distance d1 between first diffraction patterns DIP1 and second diffraction patterns DIP2 may be greater than a distance d2 between the second diffraction patterns DIP2 and third diffraction patterns DIP3. A distance d2 between the second diffraction patterns DIP2 and the third diffraction patterns DIP3 may be greater than a distance d3 between the third diffraction patterns DIP3 and fourth diffraction patterns DIP4. For example, the distance between the diffraction patterns DIP may decrease as the distance from the first display area DA1 increases. As a result, a distance dn−1 between (n−1)th diffraction patterns DIPn−1 and n-th diffraction patterns DIPn may be the smallest among the distances between adjacent diffraction patterns DIP.

The sharpness of the second display area DA2 may be changed depending on the variation in distance between the diffraction patterns DIP adjacent to each other. In more detail, the sharpness of the second display area DA2 may increase or decrease as the distance from the first display area DA1 increases when the distances between the diffraction patterns DIP adjacent to each other vary as the distance from the first display area DA1 increases.

According to the present exemplary embodiment, as the distances between the diffraction patterns DIP vary, the sharpness of the second display area DA2 may be changed. Accordingly, a difference in sharpness between the first display area DA1 and the second display area DA2 may not be viewed.

Figure 11:
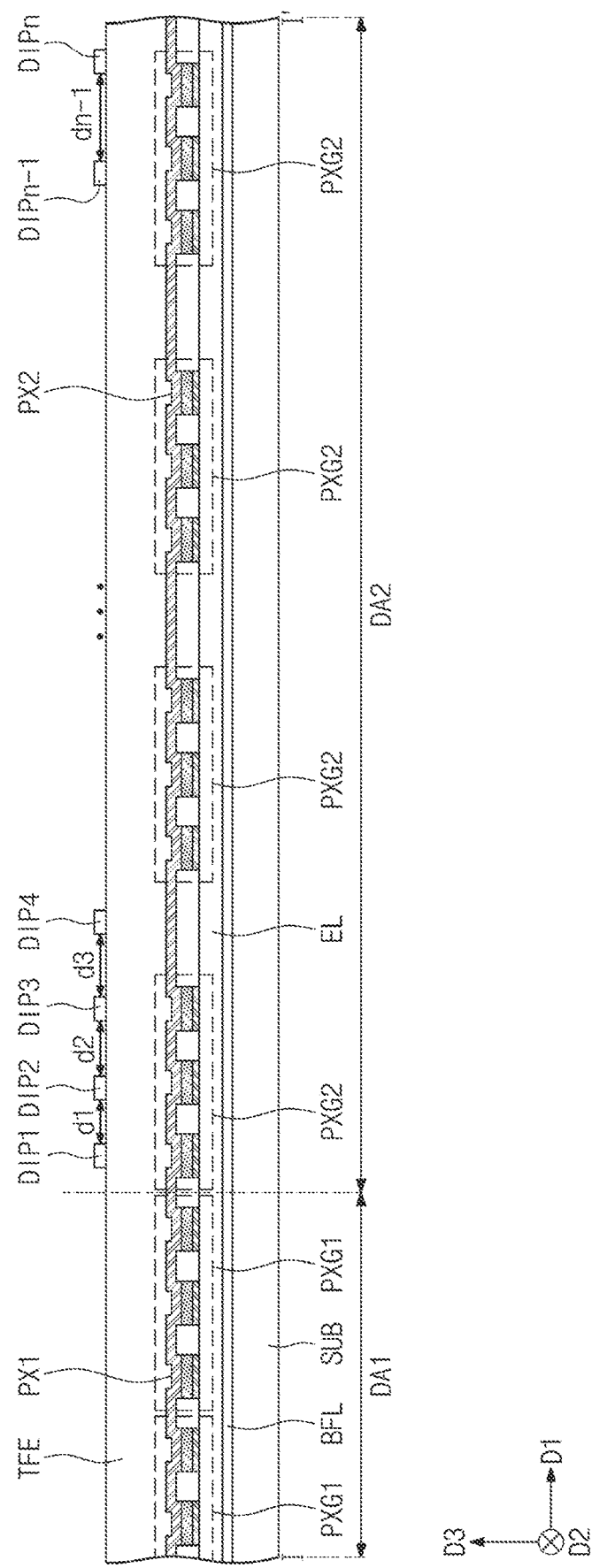

Referring to FIG. 11, distances between the diffraction patterns DIP1 to DIPn may increase as a distance from the first display area DA1 increases.

A distance d1 between first diffraction patterns DIP1 and second diffraction patterns DIP2 may be smaller than a distance d2 between the second diffraction patterns DIP2 and third diffraction patterns DIP3. The distance d2 between the second diffraction patterns DIP2 and the third diffraction patterns DIP3 may be smaller than a distance d3 between the third diffraction patterns DIP3 and fourth diffraction patterns DIP4. For example, the distance between the diffraction patterns DIP adjacent to each other may increase as the distance from the first display area DA1 increases. Consequently, a distance dn−1 between (n−1)th diffraction patterns DIPn−1 and n-th diffraction patterns DIPn may be the greatest among the distances between adjacent diffraction patterns DIP.

Heights of diffraction patterns DIP1' to DIPn' may vary as the distance from the first display area DA1 increases.

Figure 12:
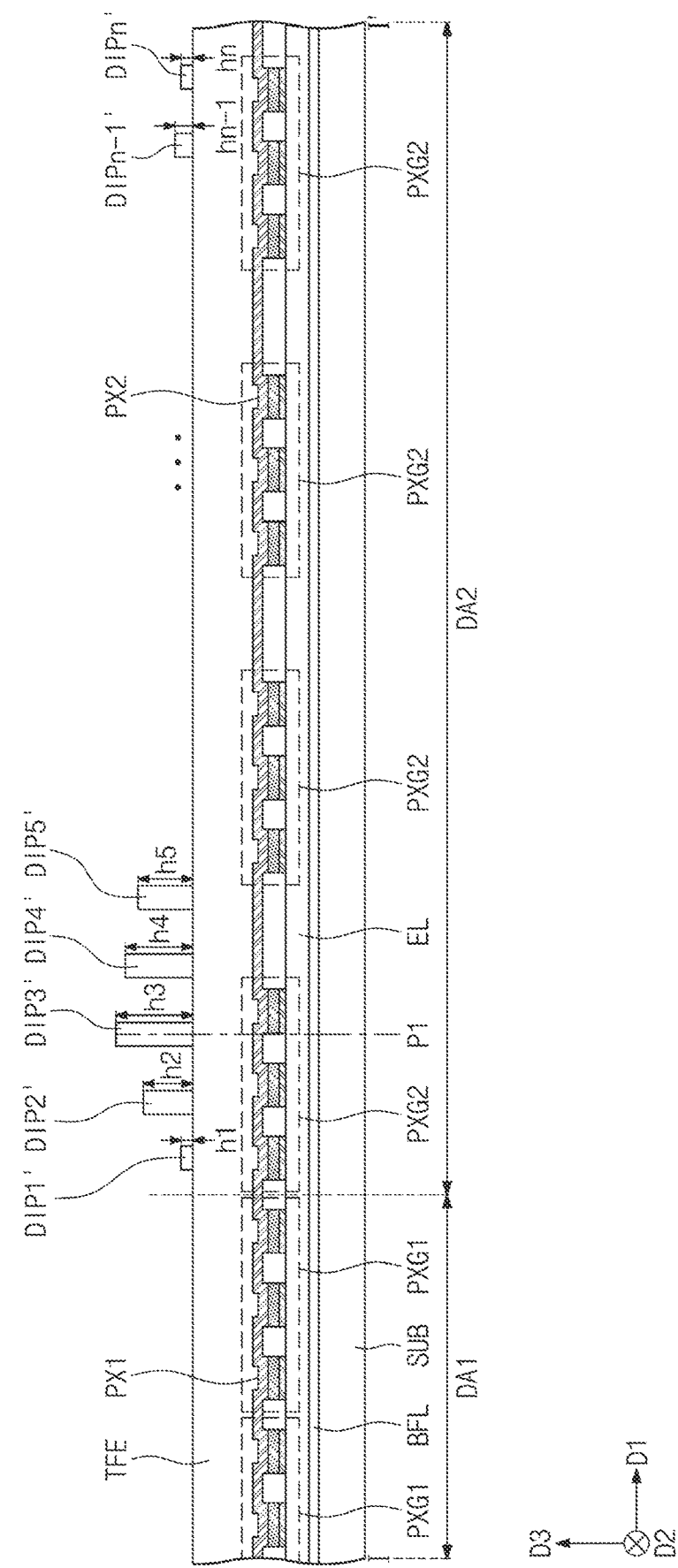

Referring to FIG. 12, heights of the diffraction patterns DIP1' to DIPn' may increase from a boundary between the first display area DA1 and a second display area DA2 to a first point P1 of the second display area DA2 and may decrease from the first point P1 to an end of the second display area DA2. In this case, distances between diffraction patterns DIP1' to DIPn' may be uniformly maintained.

In detail, heights h1 of first diffraction patterns DIP1' may be smaller than heights h2 of second diffraction patterns DIP2'. The heights h2 of the second diffraction patterns DIP2' may be smaller than heights h3 of third diffraction patterns DIP3'. For example, the heights of the diffraction patterns may increase from the first diffraction patterns DIP1' to the third diffraction patterns DIP3'. A position at which the third diffraction patterns DIP3' are disposed may be defined as the first point P1.

The heights h3 of the third diffraction patterns DIP3' may be greater than heights h4 of fourth diffraction patterns DIP4'. The heights h4 of the fourth diffraction patterns DIP4' may be greater than heights h5 of fifth diffraction patterns DIP5'. Heights hn−1 of (n−1)th diffraction patterns DIPn−1' may be greater than heights hn of n-th diffraction patterns DIPn'.

As shown in FIG. 12, the heights of the first diffraction patterns DIP'1 that are adjacent to the first display area DA1 may be designed to be low. This is because the first diffraction patterns DIP'1 that are adjacent to the first display area DA1 may exert influence on the sharpness of the first display area DA1. In detail, the first diffraction patterns DIP1' may diffract lights provided from second pixel groups PXG2 disposed in the second display area DA2 and also lights provided from some first pixel groups PXG1 disposed in the first display area DA1. Resulting in a change of sharpness of the first display area DA1. The first diffraction patterns DIP1' may be designed to have a height to reduce the above-mentioned phenomenon.

Figure 13:
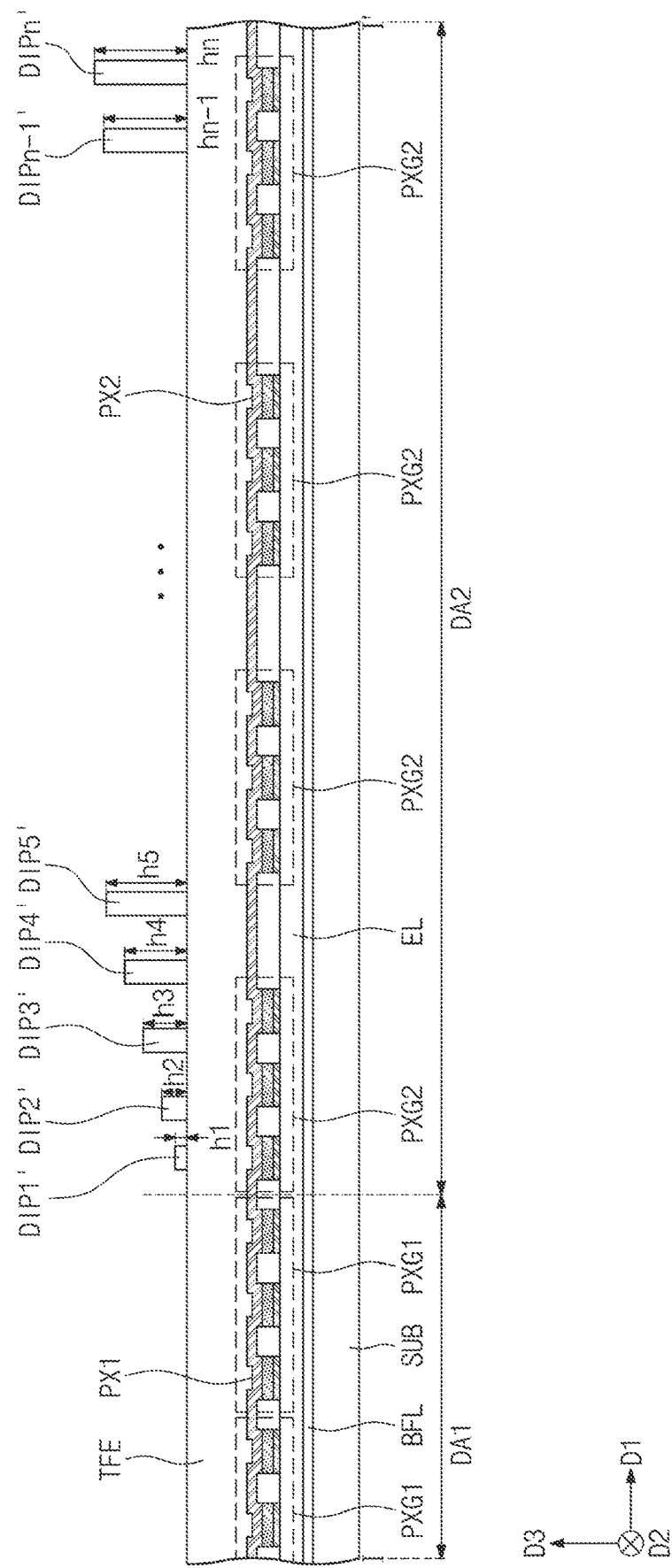

Referring to FIG. 13, heights of diffraction patterns DIP1' to DIPn' may increase as a distance from a first display area DA1 increases. Distances between diffraction patterns DIP1' to DIPn' disposed on second pixels PX2 may be uniformly maintained.

The heights of the diffraction patterns DIP1' to DIPn' may increase from first diffraction patterns DIP1' to n-th diffraction patterns DIPn'. Among the heights of the diffraction patterns DIP', the height h1 of the first diffraction patterns DIP1' is the smallest. The height hn of the n-th diffraction patterns DIPn' is the greatest. In this case, since the height h1 of the first diffraction patterns DIP1' is smallest, the sharpness of the first display area DA1 may not be affected.

According to the present exemplary embodiment, a difference in sharpness between the first display area DA1 and the second display area DA2 may be first reduced by the diffraction patterns DIP'. Therefore, the display quality may be increased.

Additionally, as the heights of the diffraction patterns DIP' vary, the sharpness of the second display area DA2 may be changed. Therefore, the difference in sharpness between the first display area DA1 and the second display area DA2 may not be viewed.

Figure 14:
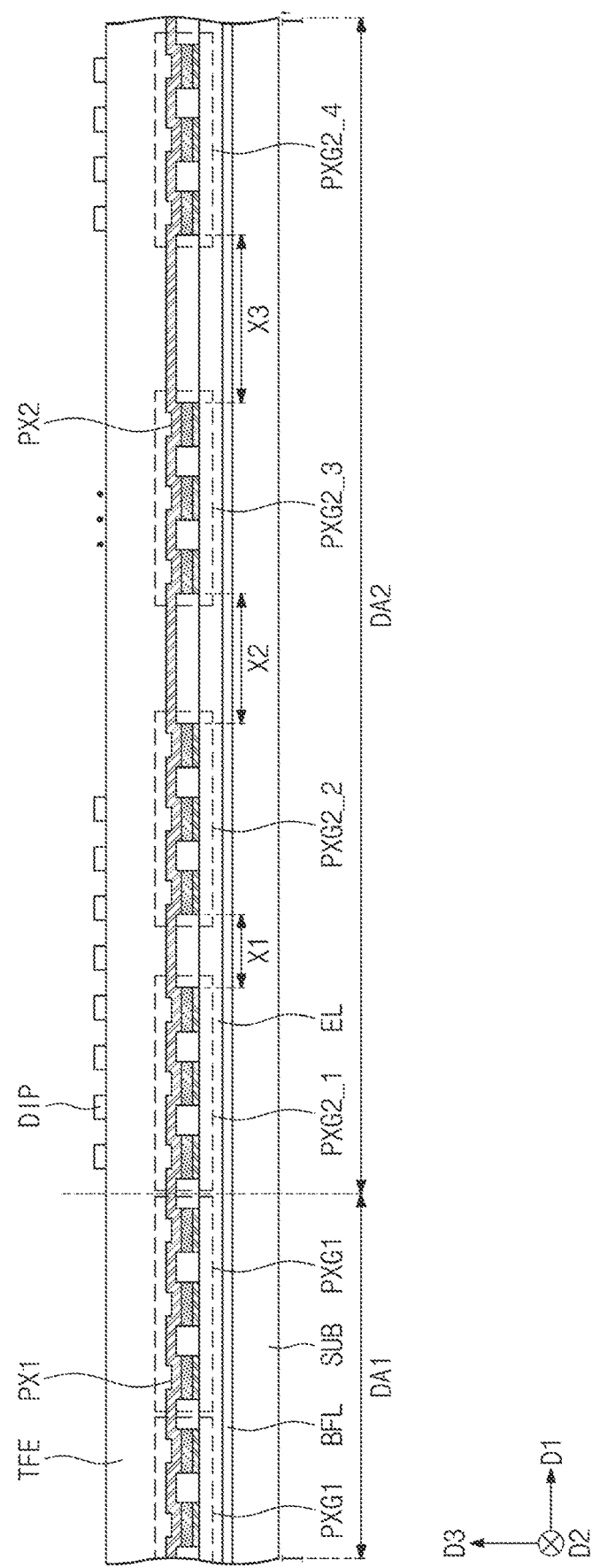

Referring to FIG. 14, distances between second pixel groups PXG2 may vary as a distance from a first display area DA1 increases.

In detail, the plural second pixel groups PXG2 may be arranged in a second display area DA2. For example, the second pixel groups PXG2 may include a first group PXG2_1, a second group PXG2_2, a third group PXG2_3, and a fourth group PXG2_4. The groups may be arranged in the first direction D1 to be spaced apart from each other.

The first group PXG2_1 may be defined as a pixel group adjacent to the first display area DA1 among the second pixel groups PXG2 in the first direction D1. The fourth group PXG2_4 may be defined as a pixel group farthest from the first display area DA1 among the second pixel groups PXG2 in the first direction D1.

A distance x1 between the first group PXG2_1 and the second group PXG2_2 may be smaller than a distance x2 between the second group PXG2_2 and the third group PXG2_3. The distance x2 between the second group PXG2_2 and the third group PXG2_3 may be smaller than a distance x3 between the third group PXG2_3 and the fourth group PXG2_4. For example, the distances between the second pixel groups PXG2 adjacent to each other may increase as the distance from the first display area DA1 increases. Additionally or alternatively, as the distance from the first display area DA1 increases, the number of pixels disposed per unit area of the second display area DA2 may decrease.

In this case, distances between diffraction patterns DIP disposed above the second pixels PX2 may be uniformly maintained. Accordingly, the sharpness of the second display area DA2 may be lowered as the distance from the first display area DA1 increases.

According to the present disclosure, a difference in sharpness between the first display area DA1 and the second display area DA2 may be reduced by the diffraction patterns DIP disposed on the second display area DA2. Therefore, the display quality may be increased.

Additionally, as the distances between the second pixel groups PXG2 vary, the sharpness of the second display area DA2 may be changed. Therefore, the difference in sharpness between the first display area DA1 and the second display area DA2 may not be viewed.

Figure 15:
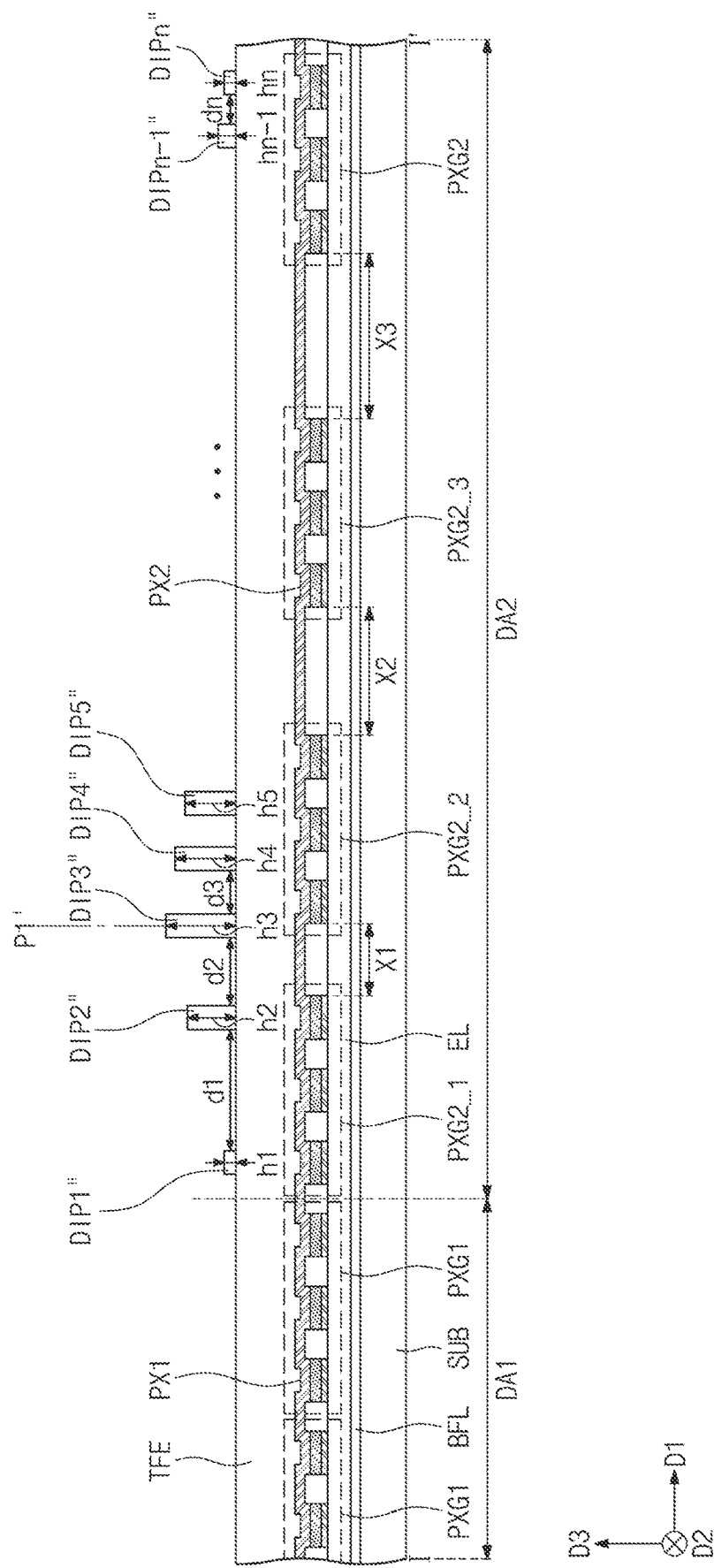

Referring to FIG. 15, the above-described embodiments may be combined with each other. For example, distances between diffraction patterns DIP1" to DIPn" may decrease as a distance from a first display area DA1 increases. For example, the distances may have a relationship of d1>d2>d3> . . . >dn−1.

Heights of the diffraction patterns DIP1" to DIPn" may increase from a boundary between the first display area DA1 and a second display area DA2 to a first point P1' of the second display area DA2 and may decrease from the first point P1' to an end of the second display area DA2. For example, heights of first diffraction patterns DIP1" to third diffraction patterns DIP3" may satisfy a relationship of h1<h2<h3. Heights of the third diffraction patterns DIP3" to n-th diffraction patterns DIPn" may satisfy a relationship of h3>h4>h5> . . . >hn−1>hn.

Distances between second pixel groups PXG2 may increase as a distance from the first display area DA1 increases. For example, the distances between the second pixel groups PXG2 may satisfy a relationship of x1<x2<x3.

According to the exemplary embodiment of the present disclosure, as the diffraction patterns are disposed in the second display area DA2 in which the sensors are disposed, the difference in sharpness between the first display area DA1 and the second display area DA2 may be reduced. Therefore, the display quality may be increased.

Additionally or alternatively, according to the exemplary embodiment of the present disclosure, the sharpness of the second display area DA2 may vary by the diffraction patterns DIP, DIP', and DIP" or the second pixel groups PXG2, which have a variety of arrangements. Accordingly, the difference in sharpness between the first display area DA1 and the second display area DA2 may not be viewed.

Thus, according to embodiments of the present disclosure, the density of pixels in one region of a display (e.g., second display are DA2) may be reduced due to the presence of sensors (or additional sensors) in that region compared to another region of the display. To mitigate the impact that the disparity in pixel density could cause, diffraction patterns may be formed over the region with reduced pixel density to reduce the sharpness of the display in the region with reduced pixel density. In some cases, the diffraction patterns may be gradually adjusted across the length of the region with reduced pixel density so that the reduced number of pixels and the change in sharpness will not be noticed by a user.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A display device comprising:
a substrate comprising a first display area and a second display area;
a plurality of first pixels disposed on the first display area;
a plurality of second pixels disposed on the second display area; and
a plurality of diffraction patterns disposed on the second pixels, wherein an array density of the first pixels disposed in the first display area is greater than an array density of the second pixels disposed in the second display area when viewed in a plane.

2. The display device of claim 1, wherein distances between the diffraction patterns vary based on a distance from the first display area.

3. The display device of claim 2, wherein the distances between the diffraction patterns decrease as the distance from the first display area increases.

4. The display device of claim 3, wherein heights of the diffraction patterns increase from a boundary between the first display area and the second display area to a first point of the second display area and decrease from the first point to an edge of the second display area.

5. The display device of claim 4, wherein the second pixels are grouped into a plurality of pixel groups, and distances between the pixel groups increase as the distance from the first display area increases.

6. The display device of claim 1, wherein distances between the diffraction patterns increase as a distance from the first display area increases.

7. The display device of claim 1, wherein the diffraction patterns comprise an inorganic material.

8. The display device of claim 1, wherein each of the diffraction patterns has a cylindrical shape.

9. The display device of claim 1, wherein each of the diffraction patterns has a polygonal pillar shape.

10. The display device of claim 1, further comprising a thin-film encapsulation layer disposed on the first pixels and the second pixels, wherein the diffraction patterns are disposed on the thin-film encapsulation layer.

11. The display device of claim 1, further comprising at least one sensor disposed under the substrate and overlapping the second display area.

12. A display device comprising:
a substrate comprising a first display area and a second display area;
a plurality of first pixels disposed on the first display area;
a plurality of second pixels disposed on the second display area; and
a plurality of diffraction patterns disposed on the second pixels, wherein an array density of the first pixels disposed in the first display area is greater than an array density of the second pixels disposed in the second display area when viewed in a plane, and heights of the diffraction patterns vary as a distance from the first display area increases.

13. The display device of claim 12, wherein the heights of the diffraction patterns increase from a boundary between the first display area and the second display area to a first point of the second display area and decrease from the first point to an end of the second display area.

14. The display device of claim 12, wherein the heights of the diffraction patterns increase as the distance from the first display area increases.

15. The display device of claim 12, further comprising a thin-film encapsulation layer disposed on the first pixels and the second pixels, wherein the diffraction patterns are disposed on the thin-film encapsulation layer.

16. The display device of claim 12, wherein distances between the diffraction patterns are uniformly maintained.

17. A display device comprising:
a substrate comprising a first display area and a second display area;
a plurality of first pixels disposed on the first display area;
a plurality of second pixels disposed on the second display area; and
a plurality of diffraction patterns disposed on the second pixels, wherein the first pixels are grouped into a plurality of first pixel groups, the second pixels are grouped into a plurality of second pixel groups, an array density of the first pixels disposed in the first display area is greater than an array density of the second pixels disposed in the second display area when viewed in a plane, and distances between the second pixel groups vary as a distance from the first display area increases.

18. The display device of claim 17, wherein the distances between the second pixel groups increase as the distance from the first display area increases.

19. The display device of claim 17, wherein distances between the diffraction patterns are uniformly maintained.

20. The display device of claim 17, wherein the distances between the diffraction patterns vary based on the distance from the first display area.

* * * * *